(12) United States Patent
Hua et al.

(10) Patent No.: US 12,525,434 B2
(45) Date of Patent: Jan. 13, 2026

(54) ARCING REDUCTION IN WAFER BEVEL EDGE PLASMA PROCESSING

(71) Applicant: Lam Research Corporation, Fremont, CA (US)

(72) Inventors: Xuefeng Hua, Foster City, CA (US); Wei Yi Luo, Fremont, CA (US); Jack Chen, San Francisco, CA (US)

(73) Assignee: Lam Research Corporation, Fremont, CA (US)

( * ) Notice: Subject to any disclaimer, the term of this patent is extended or adjusted under 35 U.S.C. 154(b) by 531 days.

(21) Appl. No.: 18/010,760

(22) PCT Filed: Aug. 12, 2021

(86) PCT No.: PCT/US2021/045657
§ 371 (c)(1),
(2) Date: Dec. 15, 2022

(87) PCT Pub. No.: WO2022/051073
PCT Pub. Date: Mar. 10, 2022

(65) Prior Publication Data
US 2023/0215692 A1  Jul. 6, 2023

Related U.S. Application Data

(60) Provisional application No. 63/073,351, filed on Sep. 1, 2020.

(51) Int. Cl.
*H01J 37/32* (2006.01)
*C23C 14/04* (2006.01)
(Continued)

(52) U.S. Cl.
CPC .. *H01J 37/32146* (2013.01); *H01J 37/32091* (2013.01); *H01J 37/32385* (2013.01);
(Continued)

(58) Field of Classification Search
CPC .......... H01J 37/32146; H01J 37/32091; H01J 37/32385; H01J 37/32568;
(Continued)

(56) References Cited

U.S. PATENT DOCUMENTS 8,137,501 B2   3/2012   Kim et al.
10,128,090 B2  11/2018  Valcore, Jr. et al.
(Continued)

OTHER PUBLICATIONS

Notification of Transmittal of the ISR & Written Opinion PCT/US2021/045657, and the Written Opinion, dated Dec. 7, 2021.
(Continued)

*Primary Examiner* — Anita K Alanko
(74) *Attorney, Agent, or Firm* — PENILLA IP, APC

(57) ABSTRACT

Methods and systems for processing a bevel edge of a wafer in a bevel plasma chamber. The method includes receiving a pulsed mode setting for a RF generator of the bevel plasma chamber. The method includes identifying a duty cycle for the pulsed mode, the duty cycle defining an ON time and an OFF time during each cycle of power delivered by the generator. The method includes calculating or accessing a compensation factor to an input RF power setting of the generator. The compensation factor is configured to add an incremental amount of power to the input power setting to account for a loss in power attributed to the duty cycle to be run in the pulsed mode. The method is configured to run the generator in the pulse mode with the duty cycle and the pulsing frequency. The generator is configured to generate the input power in pulsing mode that includes incremental amount of power to achieve an effective power in the bevel plasma chamber to achieve a target bevel processing throughput, while reducing charge build-up that causes arcing damage.

20 Claims, 11 Drawing Sheets

(51) Int. Cl.
  *H01L 21/02* (2006.01)
  *H01L 21/3065* (2006.01)
  *H01L 21/66* (2006.01)

(52) U.S. Cl.
  CPC ........ *H01J 37/32568* (2013.01); *C23C 14/04* (2013.01); *H01J 37/32165* (2013.01); *H01J 2237/038* (2013.01); *H01J 2237/24564* (2013.01); *H01J 2237/334* (2013.01); *H01J 2237/335* (2013.01); *H01L 21/02057* (2013.01); *H01L 21/02087* (2013.01); *H01L 21/3065* (2013.01); *H01L 22/12* (2013.01)

(58) Field of Classification Search
  CPC .......... H01J 37/32165; H01J 2237/038; H01J 2237/24564; H01J 2237/334; H01J 2237/335; H01L 21/02057; H01L 21/02087; H01L 21/3065; H01L 22/12; C23C 14/04
  USPC .......................................... 156/345.1–345.55
  See application file for complete search history.

(56) References Cited

U.S. PATENT DOCUMENTS

| | | |
|---|---|---|
| 2008/0182412 A1 | 7/2008 | Bailey, III et al. |
| 2008/0190448 A1 | 8/2008 | Kim et al. |
| 2013/0050892 A1 | 2/2013 | Kuthi et al. |
| 2013/0213573 A1 | 8/2013 | Valcore, Jr. et al. |
| 2013/0213934 A1 | 8/2013 | Valcore, Jr. |
| 2013/0214682 A1 | 8/2013 | Valcore, Jr. |
| 2013/0214683 A1 | 8/2013 | Valcore, Jr. |
| 2013/0214828 A1 | 8/2013 | Valcore, Jr. et al. |
| 2014/0009073 A1 | 1/2014 | Valcore, Jr. et al. |
| 2014/0167613 A1 | 6/2014 | Fong et al. |
| 2014/0172335 A1 | 6/2014 | Valcore, Jr. et al. |
| 2014/0195033 A1 | 7/2014 | Lyndaker et al. |
| 2014/0210508 A1 | 7/2014 | Valcore, Jr. et al. |
| 2014/0214350 A1 | 7/2014 | Valcore, Jr. et al. |
| 2014/0214351 A1 | 7/2014 | Valcore, Jr. et al. |
| 2014/0214395 A1 | 7/2014 | Valcore, Jr. et al. |
| 2014/0265852 A1 | 9/2014 | Valcore, Jr. |
| 2014/0305589 A1 | 10/2014 | Valcore, Jr. |
| 2015/0048740 A1 | 2/2015 | Valcore, Jr. et al. |
| 2015/0069912 A1 | 3/2015 | Valcore, Jr. et al. |
| 2015/0091440 A1 | 4/2015 | Marakhtanov et al. |
| 2015/0091441 A1 | 4/2015 | Marakhtanov et al. |
| 2015/0214012 A1 | 7/2015 | Valcore, Jr. et al. |
| 2015/0311041 A1 | 10/2015 | Valcore, Jr. et al. |
| 2016/0044775 A1 | 2/2016 | Valcore, Jr. et al. |
| 2016/0172162 A1 | 6/2016 | Fong et al. |
| 2016/0189937 A1 | 6/2016 | Valcore, Jr. et al. |
| 2016/0233058 A1 | 8/2016 | Marakhtanov et al. |
| 2016/0240356 A1 | 8/2016 | Howald et al. |
| 2016/0259872 A1 | 9/2016 | Howald et al. |
| 2016/0276137 A1 | 9/2016 | Valcore, Jr. et al. |
| 2016/0307736 A1 | 10/2016 | Howald et al. |
| 2016/0307738 A1 | 10/2016 | Marakhtanov et al. |
| 2016/0308560 A1 | 10/2016 | Howald et al. |
| 2016/0322207 A1 | 11/2016 | Howald et al. |
| 2016/0336152 A1 | 11/2016 | Valcore, Jr. et al. |
| 2017/0032945 A1 | 2/2017 | Valcore, Jr. et al. |
| 2017/0084432 A1 | 3/2017 | Valcore, Jr. et al. |
| 2017/0103872 A1 | 4/2017 | Howald et al. |
| 2017/0133202 A1 | 5/2017 | Berry, III |
| 2017/0178864 A1 | 6/2017 | Valcore, Jr. et al. |
| 2017/0178873 A1 | 6/2017 | Valcore, Jr. et al. |
| 2017/0194130 A1 | 7/2017 | Lyndaker et al. |
| 2017/0294293 A1 | 10/2017 | Howald et al. |
| 2017/0330730 A1 | 11/2017 | Kubota |
| 2017/0330732 A1 | 11/2017 | Valcore, Jr. et al. |
| 2017/0358428 A1* | 12/2017 | Kawasaki ......... H01J 37/32183 |
| 2018/0018418 A1 | 1/2018 | Valcore, Jr. et al. |
| 2018/0033596 A1 | 2/2018 | Valcore, Jr. et al. |
| 2018/0053632 A1 | 2/2018 | Fong et al. |
| 2018/0068834 A1 | 3/2018 | Valcore, Jr. et al. |
| 2018/0261430 A1 | 9/2018 | Kawasaki |
| 2018/0294140 A1 | 10/2018 | Valcore, Jr. et al. |
| 2018/0323038 A1 | 11/2018 | Valcore, Jr. et al. |
| 2019/0057847 A1 | 2/2019 | Valcore, Jr. et al. |
| 2019/0272306 A1 | 9/2019 | Howald et al. |
| 2019/0318919 A1 | 10/2019 | Lyndaker et al. |
| 2020/0067545 A1 | 2/2020 | Howald et al. |
| 2020/0074034 A1 | 3/2020 | Valcore, Jr. et al. |
| 2020/0218774 A1 | 7/2020 | Howald et al. |
| 2020/0243304 A1 | 7/2020 | Valcore, Jr. et al. |

OTHER PUBLICATIONS

Chae et al. Application of Pulsed Plasmas for Nanoscale Etching of Semiconductor Devices: A Review Journal of the Korean Institute of surface engineering, vol. 48, No. 6, Dec. 31, 20, pp. 360-370.

* cited by examiner

Arcing Damage 250

ARCING REDUCTION IN WAFER BEVEL EDGE PLASMA PROCESSING

CLAIM OF PRIORITY

This application is a national stage filing of and claims priority, under 35 U.S.C. § 371, to PCT/US21/45657, filed on Aug. 12, 2021, and titled "ARCING REDUCTION IN WAFER BEVEL EDGE PLASMA PROCESSING", which claims the benefit of and priority, under 35 U.S.C. § 119(e), to U.S. Provisional Patent Application No. 63/073,351, filed on Sep. 1, 2020, and titled "ARCING REDUCTION IN WAFER BEVEL EDGE PLASMA PROCESSING", all of which are incorporated by reference herein in their entirety.

BACKGROUND

1. Field of the Invention

The present embodiments relate to semiconductor wafer processing equipment tools and processing, and more particularly, methods for reducing arcing in wafers during bevel edge plasma processing.

2. Description of the Related Art

Some semiconductor processing systems may employ plasma when depositing thin films on a substrate in a processing chamber. Generally, the substrate is placed on a substrate support in the processing chamber, gases are introduced, and radio frequency (RF) power is supplied to create plasma.

In bevel edge processing, the edge of the wafer may be processed to deposit films over the edge or remove films over the edge. Depending on the process being performed on the main wafer surface area, a film may be deposited over the edge in order to protect the edge from aggressive chemistries and processes. In the case of bevel edge etching, it is common to remove material build-up and/or films formed over the edge. Bevel edge etching is also referred to as bevel edge cleaning, since material from the bevel edge is removed to prevent flaking of bevel edge material, which may redeposit over the wafer surface and cause defects.

Although bevel edge processing is well known and widely used in semiconductor processing, a problem with electrical arcing has started to occur. Since bevel edge processing is employed to deposit films on the wafer edge and clean bevel material from the wafer edge, such processes tend to produce charge build-up. In bevel edge processing, RF power is generally delivered by a continuous wave (CW) RF generator in order to increase the amount of power that enables sufficient deposition efficiencies or sufficient etch rates. Specifically, a CW RF generator is used for bevel edge processing since the processes are targeted to the edge, and elevated power levels are believed to be less detrimental to the edge as compared to plasma processing, the wafer surface having highly engineered feature geometries and materials.

Unfortunately, delivering power using CW RF generators is causing significant charge build-up in the wafer edge, which tends to accumulate. This accumulation of charge then causes electrical arcing with metallic materials formed on the wafer surface near the edge. The damage caused to the wafer surface near the edge has been seen to cause defects in devices and may also contribute to reductions in yield.

It is in this context that inventions arise.

SUMMARY

Methods and systems for processing a bevel edge of a wafer in a bevel plasma chamber. The method includes receiving a pulsed mode setting for a generator of the bevel plasma chamber. The method includes identifying a duty cycle for the pulsed mode, the duty cycle defining an ON time and an OFF time during each cycle of power delivered by the generator. The method includes calculating or accessing a compensation factor to an input power setting of the generator. The compensation factor is configured to add an incremental amount of power to the input power setting to account for a loss in power attributed to the duty cycle to be run in the pulsed mode. The method is configured to run the generator in the pulse mode with the duty cycle. The generator is configured to generate the input power that includes incremental amount of power to achieve an effective power in the bevel plasma chamber to achieve a target bevel processing throughput, while reducing charge build-up that causes arcing damage.

In another embodiment, a method for operating a bevel edge process in a plasma chamber is provided. The method includes providing a wafer over a lower electrode of the plasma chamber. The plasma chamber has an insulator plate disposed over the lower electrode. The insulator plate is set at a distance that is a separation from a top surface of the wafer so as to reduce plasma formation over the top surface of the wafer. The plasma chamber includes an outer lower electrode surrounding the lower electrode and an outer upper electrode surrounding the insulator plate. An edge of the wafer is disposed between the outer upper electrode and the outer lower electrode. The method includes connecting a radio frequency (RF) power generator to the lower electrode while the outer upper electrode and the outer bottom electrode are connected to a ground potential. The method includes setting the RF power generator to operate in a pulsing mode. The pulsing mode is configured to deliver a duty cycle that is greater than about a 70% setting and less than about a 99% setting. In some embodiments, the duty cycle can range between a 10% setting to about a 99% setting. The increased power level is set for a setting of the duty cycle. The increased power level is configured to offset a reduction in said etch rate when in the pulsing mode as compared to a continuous wave (CW) mode of power delivery by a CW RF power generator.

In one embodiment, during said pulsing mode, the method includes increasing a pulsing frequency setting of the RF power generator. The increased power level of the RF power generator and the increased duty cycle setting function to deliver an effective power for said bevel edge process that approximates power delivered for a continuous wave (CW) mode of power delivery by a CW RF power generator.

In one embodiment, the increased pulsing frequency functions to reduce an arcing area around a circumference of the wafer during said bevel edge process.

DESCRIPTION

Embodiments of the disclosure provide systems and methods for reducing arcing during wafer bevel edge processing by reducing charge build-up in the wafer edge region. In one configuration, the bevel edge processing operation is carried out in a plasma processing chamber that is designed to focus on processing the wafer edge, while avoiding processing of the top surface of the wafer. In these chamber configurations, radio frequency (RF) power is delivered to an electrode of the chamber to produce a capacitively coupled plasma (CCP) condition, that provides for either deposition or etching over the wafer edge. In one configuration, RF power is delivered to the electrode in a pulsed configuration, which is configured to reduce charge build-up during the processing.

It should be appreciated that the present embodiments can be implemented in numerous ways, such as a process, an apparatus, a system, a device, or a method. Several embodiments are described below.

Figure 1:
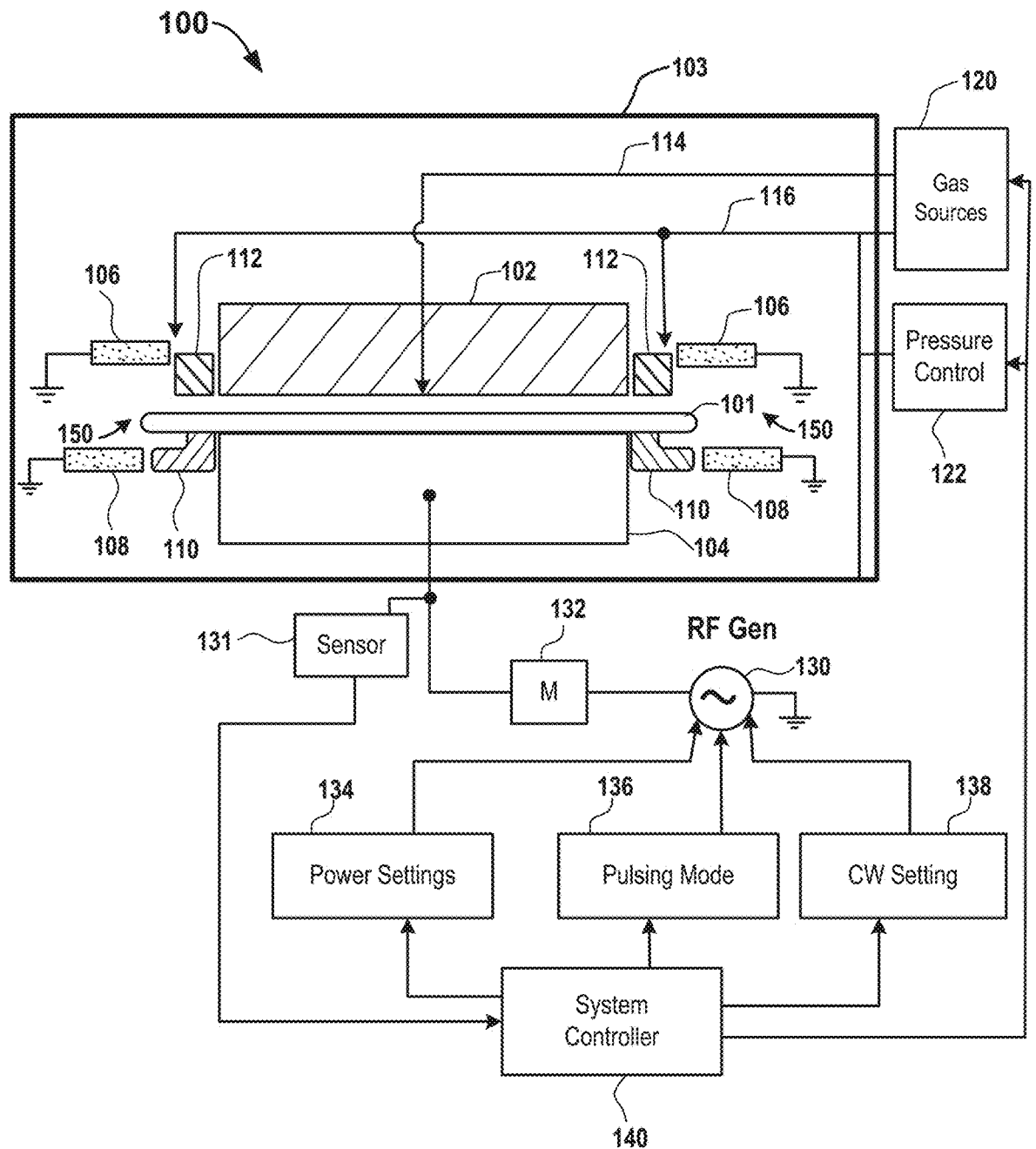
FIG. 1 illustrates a plasma system 100 that includes a bevel processing chamber, in accordance with one embodiment.

FIG. 1 illustrates a plasma system 100 that includes a bevel processing chamber 103, in accordance with one embodiment. The bevel processing chamber 103 is designed for either deposition or etching of an edge of a wafer, when placed over a lower electrode 104. As shown, wafer 101 is disposed over lower electrode 104, and the lower electrode 104 is sometimes referred to as a chuck or substrate support.

Disposed opposite the lower electrode 104 is an insulator plate 102. The insulator plate 102 is placed in close proximity to the top surface of the wafer 101. The reason the insulator plate 102 is placed in close proximity to the top surface of the wafer 101 is to protect the top surface of the wafer 101 when the edge of the wafer 101 is processed.

By way of example, during processing, a separation distance between the top surface of the wafer 101 and the surface of the insulator plate 102 facing the top surface of the wafer is less than 5 mm, and in some embodiments between 0.5 mm and 2 mm. In this manner, the separation distance being minimized will reduce or prevent the ignition of plasma over the surface of the wafer that is not the target of processing in the bevel processing chamber 103. As shown, the bevel processing chamber 103 may also include a lower plasma-exclusion zone (PEZ) ring 110 that surrounds the lower electrode 104. The lower PEZ ring 110 is a dielectric structure that is configured to set the amount of lower surface area of the wafer 101 that will be exposed plasma in the bevel edge region 150.

In a similar manner, and upper plasma-exclusion zone (PEZ) ring 112 is configured to surround the insulator plate 102. The upper PEZ ring 112 is also defined from a dielectric structure. The positioning and size of the upper PEZ ring 112 can be configured to expose more or less of the top surface of the wafer 101 in the bevel edge region 150. Further shown are an outer upper electrode 106, and an outer lower electrode 108. The outer upper electrode 106 is configured to surround the insulator plate 102 and also the upper PEZ ring 112. The outer lower electrode 108 similarly surrounds the lower electrode 104 and the lower PEZ ring 110. Generally, both outer upper electrode 106 and the outer lower electrode 108 are electrically grounded.

The bevel processing chamber 103 also shows connections to gas sources 120 and pressure control 122. Generally, the center gas feed 114 is configured to supply a gas to the region between the top surface of the wafer 101 and the surface of the insulator plate 102 facing the wafer. In some embodiments, the center gas feed 114 supplies an inert gas, and in other embodiments supplies process gases. An outer gas feed 116 is shown generally supplying process gases, and/or mixtures of process gases and inert gases to the bevel edge region 150.

An RF generator 130 is connected to matching network 132, and the matching network is connected to the lower electrode 104. Generally, the connections between the RF generator 130 and the lower electrode 104 are part of an RF transmission system that is optimized to deliver power to the lower electrode 104. The plasma processing chamber 103, in this configuration is referred to as a capacitively coupled plasma (CCP) chamber. RF power is delivered by the RF generator 130 to the lower electrode 104, and that power is capacitively coupled to the outer lower electrode 108 and the outer upper electrode 106. Because RF power is capacitively coupled to the outer electrodes in the bevel edge region 150, plasma is ignited in the bevel edge region 150.

The plasma that is ignited can be configured for depositing material over the bevel edge or can be configured to etch material from the bevel edge. When material is removed from the bevel edge of the wafer 101, the process is sometimes referred to as bevel edge cleaning. Bevel edge cleaning is performed to remove materials that have built up at the wafer edge to create a type of bevel. If cleaning is not performed at specific times during processing, it is possible that materials at the bevel edge could chip or flake and then redeposit over the top surface of the wafer 101. For this reason, bevel edge cleaning is a process that is systematically performed when certain processing operations are performed during semiconductor processing.

In accordance with one embodiment, the RF generator 130 is controlled to generate an amount of input power necessary to achieve an effective power used by the bevel edge process in the bevel processing chamber 103. The effect of power is generally targeted for the type of operation being performed. By way of example, if the operation includes depositing a film over the edge of the wafer 101, the effective power level is selected to make the deposition efficient and achieve a desired throughput. In the same way, if bevel edge cleaning is being performed, the effective power necessary for efficient bevel edge cleaning is targeted to achieve a desired throughput.

If the effective power is not transferred to the bevel processing chamber 103, or there is loss in the transmission of power due to processing parameters or system configurations, the rate at which the bevel process is performed can be reduced. Meaning, it will take longer to perform a deposition or in batch, which will therefore have a consequential reduction in throughput when multiple wafers are being processed through the bevel processing chamber 103.

As mentioned above, bevel processing operations typically utilize continuous wave (CW) mode generator settings. This is done because deposition and etching at the edge of the wafer 101 is not as sensitive as etch operations performed over the main surface of the wafer 101. Specifically, the main surface of the wafer 101 is commonly processed by a multitude of process operations that include deposition of materials and etching of complex structures. At the edge of the wafer, a bevel edge clean will typically just require etching down to the silicon wafer to remove the buildup of materials.

Therefore, CW mode has been utilized in bevel edge depositions and etching operations, albeit, with the detriment of charge build-up. As noted above, the charge build-up has caused arcing damage in an area over the edge of the wafer 101. The arcing damage has the further detriment of damaging devices and features that have been formed on the surface of the wafer 101.

In accordance with one embodiment, the RF generator 130 is configured by the system controller 140 to operate in a pulsing mode 136. In the pulsing mode 136, the generator is configured with a duty cycle (DC) setting and a pulsing frequency setting. Generally, the duty cycle setting sets an amount of ON time and an amount of OFF time during a specific cycle of power delivery by the RF generator 130. Because less power will be delivered by the RF generator 130 in the pulsing mode 136, the system controller 140 is configured to make an adjustment to power settings 134. The adjustment to power settings 134 are designed to increase the amount of power delivered by the RF generator 130, so that the effective power delivered to the bevel processing chamber 103 is substantially equivalent to the amount of power that would have been delivered using a CW mode. Further shown in FIG. 1, is the system controller 140 providing control to the gas sources 120 and the pressure control 122. It should be understood that the system controller 140 is generally able to make further adjustments to other processing parameters of the bevel processing chamber 103, and the reference to gas sources 120 and pressure control 122 is only by way of example.

In one embodiment, the duty cycle setting configures the duty cycle to be between about 10% and about 99%, and in one embodiment between about 70% and about 98%, and in one embodiment between about 80% and about 97%, and in one embodiment between about 85% and about 95%, and in a specific embodiment about 90%. Based on the setting of the duty cycle, the system controller 140 is configured to make a corresponding adjustment to the power settings 134. By way of example, if the duty cycle is closer to 99%, then the amount by which the power settings 134 are increased is lower than if the duty cycle is set closer to 10%. Therefore, the lower the duty cycle (i.e., ON time), the greater the increase in power required to be set by the system controller 140 in the power settings 134.

In one embodiment, it is also possible to adjust pulsing frequency setting in pulsing mode 136. The system controller 140 can tune the pulsing frequency of the RF generator 130, in order to adjust the amount of area around the circumference of the edge of the wafer 101 that could potentially be exposed to arcing damage. As will be described below, increasing the pulsing frequency of the RF generator 130 has a corresponding effect to reduce the amount of area that is subjected to arcing damage around the circumference of the edge of the wafer 101.

In one embodiment, adjusting the pulsing frequency is an optional tuning knob, and only the pulsing mode and power settings need be adjusted to reduce the amount of arcing damage. Generally, the system controller 140 is configured to make adjustments to the RF generator 130 to operate in a pulsing mode 136 to adjust duty cycle and pulsing frequency and to make power adjustments 134, to reduce charge build-up that causes arcing damage on the surface of the wafer 101 in the bevel edge region 150. In one embodiment, a continuous wave (CW) settings 138 is provided. If the system needs to operate in a CW mode for a period of time, the CW settings 138 are activated by the controller 140. In one embodiment, the controller 140 can be programmed to execute a process that follows a recipe for a bevel process. In other embodiments, the controller 140 can process a recipe and make dynamic adjustments based on feedback received from one or more sensors that measure parameters to determine effective power delivery. In some cases, the sensors of the bevel plasma system can include optical sensors, endpoint detection sensors, and other electrical measurement sensors.

Figure 2A:
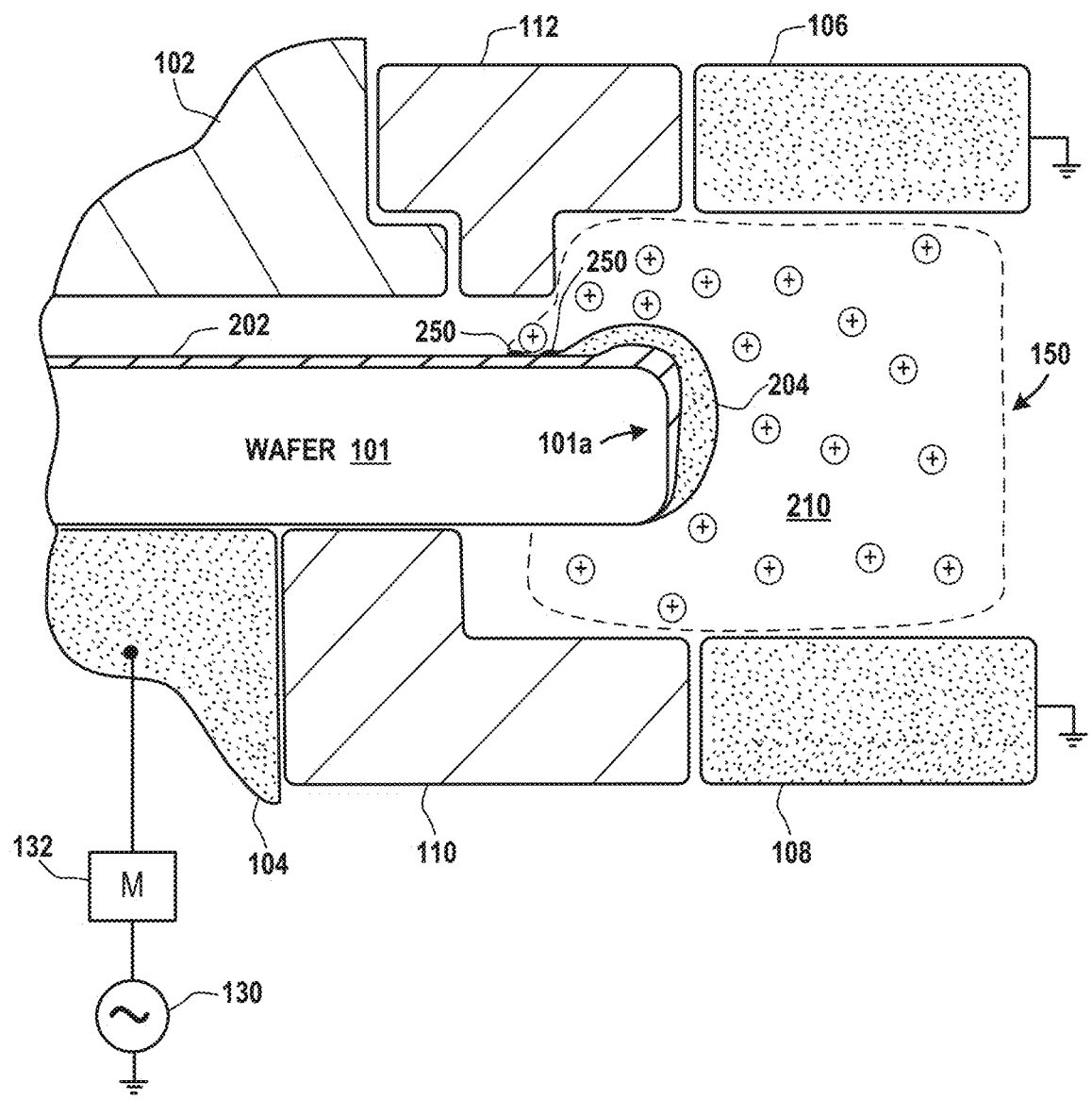
FIGS. 2A and 2B illustrate a magnified view of the bevel edge region, in accordance with one embodiment.

FIG. 2A illustrates a magnified view of the bevel edge region 150, in accordance with one embodiment. Specifically, an edge 101a of wafer 101 overhangs into the bevel edge region 150, so that processing of the top surface edge and bottom surface of the wafer 101 can be performed. As mentioned above, the upper PEZ ring 112 is configured to suppress plasma from forming over the top surface of the wafer 101, just as the proximity of the insulator plate 102 protects the top surface of the wafer 101. Generally, the sizing and extent to which the upper PEZ ring 112 extends over the wafer 101 will define the area that will be subjected to processing. The same optimization occurs with reference to the lower PEZ ring 110.

In this illustration, the wafer 101 is shown having a film 202 deposited thereon. For purposes of discussion, the film 202 can include one or more or many films that have been deposited and processed over the wafer 101. In addition, a bevel edge process can also include deposition of a protective film 204. During the deposition of the protective film 204, the plasma 210 that is formed in the bevel edge region 150 will naturally produce charges of species that are introduced into the chamber for purposes of deposition and forming the protective film 204. However, during the deposition process in the bevel edge region 150, the build-up of charge can cause arcing damage 250 on the surface of the wafer 101. Specifically, if the film 202 has a metallic nature or metallic components, the arcing damage 250 can be exhibited over an area of the circumference of the wafer 101.

Figure 2B:
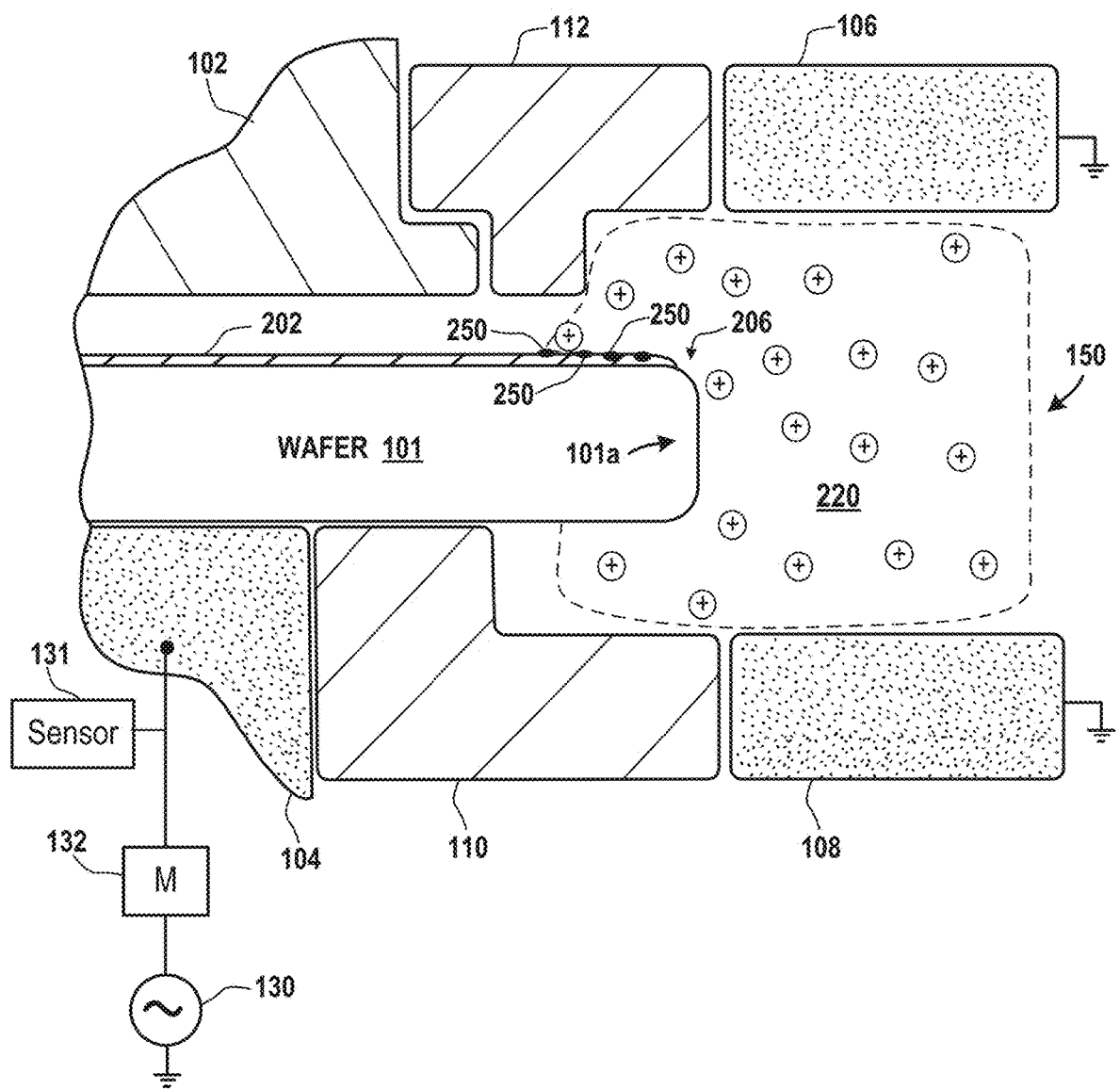

FIG. 2B illustrates an example of an etching operation designed to remove material from the edge 101*a* of the wafer 101. The process chemistries are optimized for etching, and the bevel edge of the wafer 101 is etched and commonly etched down to silicon at point 206. The bevel edge etching operation using plasma 220 will generally remove materials that built up at the edge 101*a* of the wafer 101 to prevent chipping or flaking of the bevel material. The arcing damage 250 is illustrated to occur over a top surface of the wafer 101 at the circumference of the wafer, adjacent to the region that was etched during the bevel edge cleaning operation.

Figure 3:
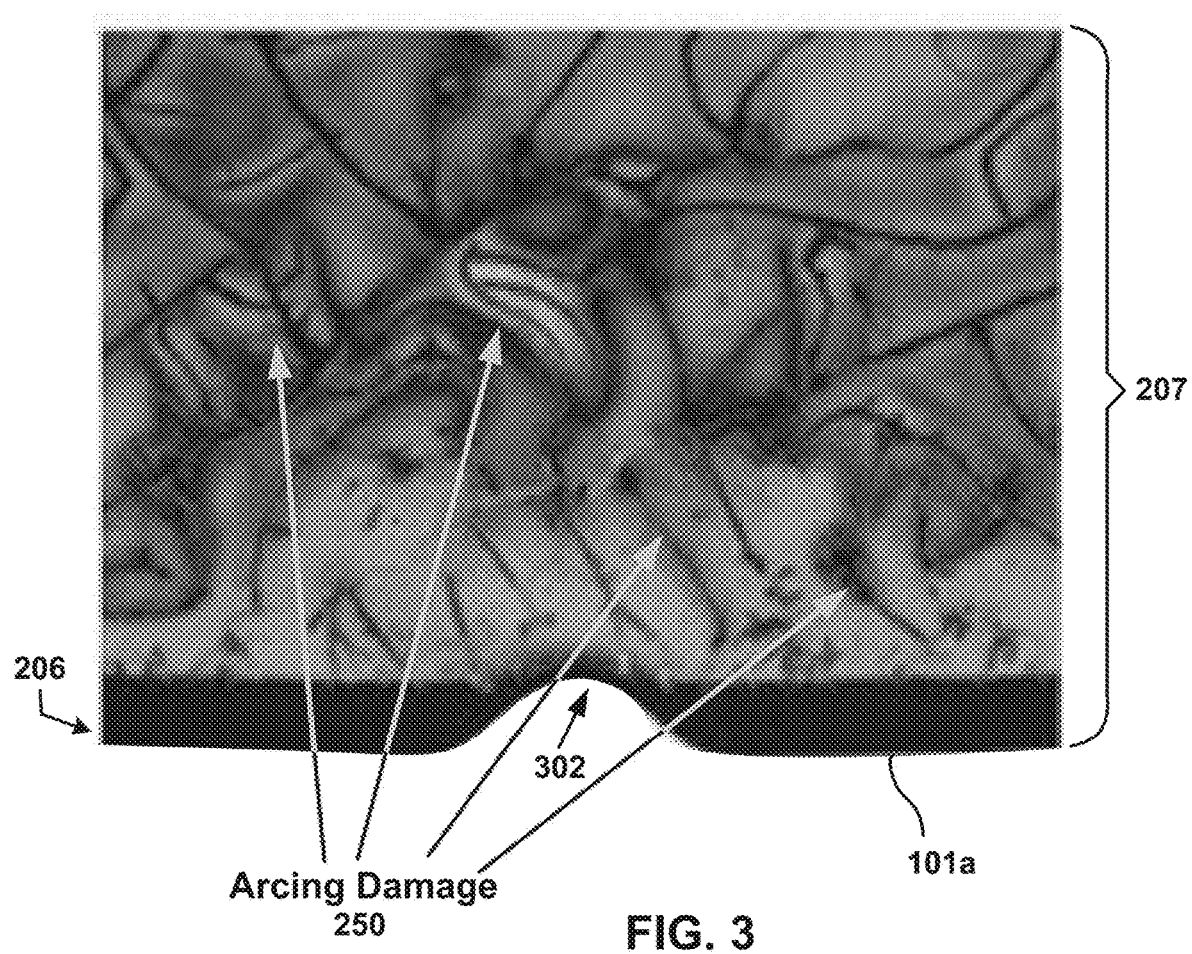
FIG. 3 provides an illustration of the type of damage that is caused by excessive charge build-up and arcing with metallic components when continuous wave mode plasma delivery is utilized for bevel edge processing.

FIG. 3 provides an illustration of the type of damage that is caused by excessive charge build-up and arcing with metallic components when continuous wave mode plasma delivery is utilized for bevel edge processing. The illustration of FIG. 3 is of an area of the circumference 207 that extends to the wafer edge 101*a*. The wafer notch 302 is illustrated for purposes of referencing the wafer edge 101*a*, and the region 206 that was etched in the bevel edge cleaning process. Unfortunately, excessive arcing damage 250 can impact devices formed near the wafer edge 101*a* and reduce yield of functional devices.

As can be appreciated, the arcing damage 250, depending on the type of material on the surface of the wafer, can be excessive. In accordance with one embodiment, the system controller 140 is configured to program a pulsing mode 136, to set a duty cycle and pulsing frequency setting for the generator. Because the pulsing mode allows for charge dissipation during the OFF state of the duty cycle, it has been shown that a substantial reduction in charge build-up occurs in the bevel edge region 150. As mentioned above, in addition to setting the pulsing mode 136, the system controller is configured to adjust the power settings 134 to compensate for the loss of power that would have been delivered if the RF generator were operating in a continuous mode. In one embodiment, the amount by which the power is adjusted upward based on the selected duty cycle is referred to as a compensation factor.

The compensation factor, in one embodiment is dynamically set once the duty cycle and the process recipe parameters are identified. In some embodiments, the compensation factor may be programmed in a table or database for specific recipes and in other embodiments, the compensation factor is applied and dynamically adjusted based on sensor feedback processed by the system controller 140.

Figure 4A:
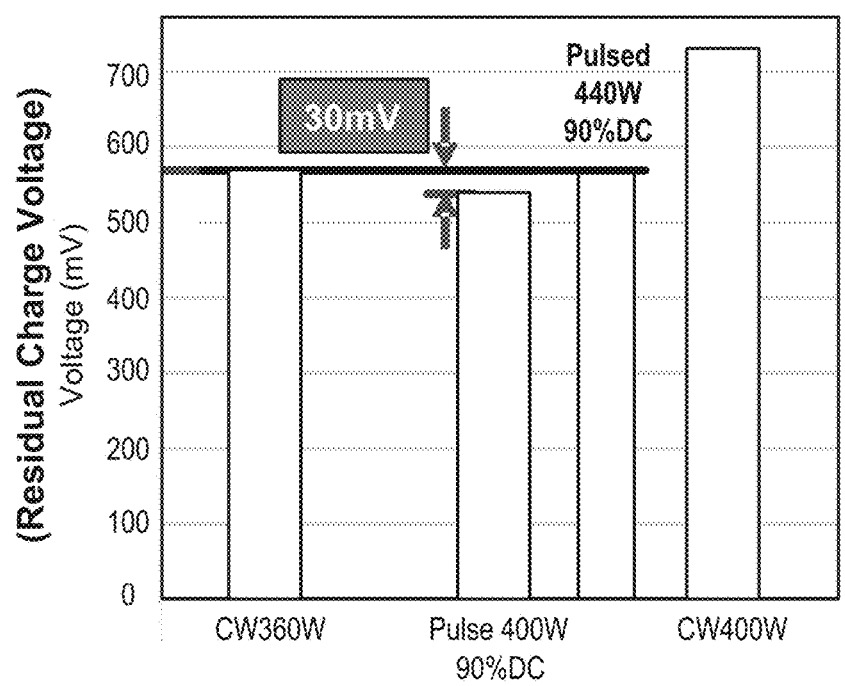
FIG. 4A illustrates an example of several test scenarios showing how a pulsing mode with a 90% duty cycle could have an approximately similar effective residual charge voltage as a continuous mode.

FIG. 4A illustrates an example of several test scenarios illustrating how a pulsing mode with a 90% duty cycle could have an approximately similar residual charge voltage as a continuous mode. As shown, a continuous mode operating at 360 Watts will have a residual charge voltage of approximately 580 mV. In the pulsing mode, the system controller 140 makes power setting adjustments 134, to increase the power to 400 Watts. The residual charge voltage is measured to be about 550 mV, or a 30 mV reduction. If the system controller 140 makes a power settings adjustment 134 to increase the power to 440 Watts, at 90% duty cycle, the residual charge voltage would be approximately 580 mV, or about equivalent to that by the continuous wave mode at 360 Watts.

Thus, with a small increase in the input power, the pulse mode bevel processing system 103 can achieve about the same residual charge voltage as a continuous wave mode bevel processing system, while substantially reducing charge build-up and detrimental arcing damage 250. In one embodiment, a compensation factor can be empirically determined and utilized by the system controller 140, to make the incremental adjustments in increased power settings 134, when a target residual charge voltage or effective power is needed by the bevel processing chamber 103. Although the power has been increased, because the pulsing mode has been activated, charge build-up is reduced because charge dissipation occurs during the off times of each cycle, based on the selected duty cycle utilize for the process. By way of example, charge dissipation occurs during after-glow in a pulsed mode after the off period starts. In one example experiment, by implementing a 90% duty cycle setting, it was shown that a reduction of residual charge voltage was achieved. In this experiment, a probe was used and placed at 148 mm, measuring from the center of the wafer to the edge, where the outer most edge is 150 mm in a 300 mm wafer.

Figure 4B:
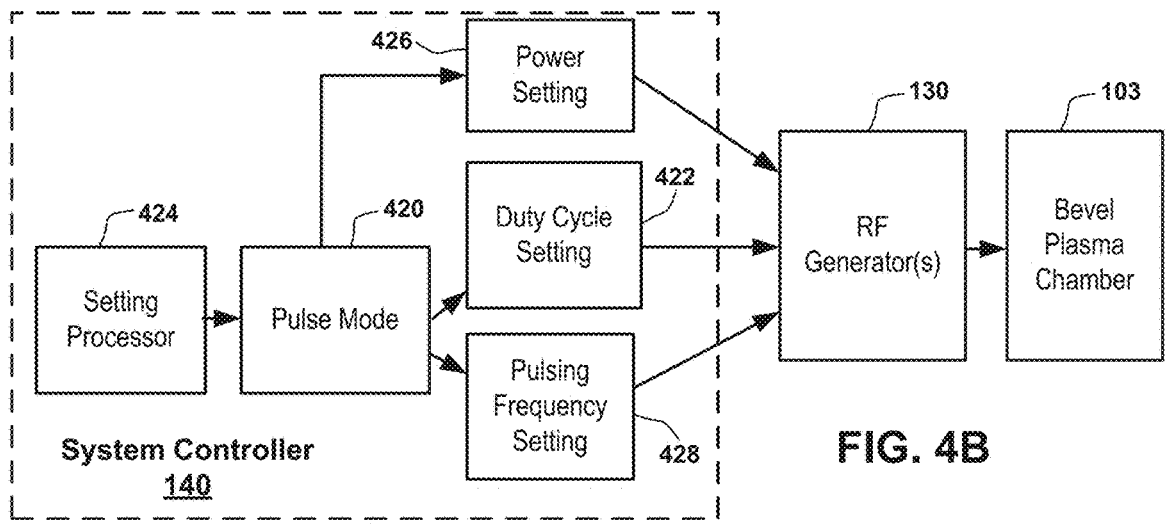
FIG. 4B illustrates another embodiment where the pulse mode is a setting that provides calculated power settings and calculated frequency settings to one or more RF generators, in accordance with one embodiment of the present invention.

FIG. 4B illustrates another embodiment where the pulse mode 420 is a setting that provides calculated power settings 426 and pulsing frequency settings 428 to one or more RF generators 130. In this embodiment, a pulse mode 420 is set as a setting by a settings processor 424 of a system controller 140 in order to carry out a process operation. As mentioned above, the process operation may be to deposit material on the bevel edge of a wafer or remove/clean material from an edge of the wafer. In either case, a recipe is identified which has been optimized to carry out the process operation. By way of example, if the process is a bevel edge etch operation, the duty cycle setting is selected from the recipe. The duty cycle, as mentioned above, may range between 10% and 99%.

In one example, the duty cycle setting may have been optimized based on one or more prior trial runs of multiple wafers and/or materials to be removed. In some cases, the duty cycle setting is selected using machine learning, which takes in as inputs many trials etch runs and quantifies results that achieve predefined metrics. In other embodiments, the duty cycle setting may be identified from test runs over time and can be adjusted based on changing conditions of the chamber or materials being etched or deposited. In some cases, the duty cycle setting may be obtained from a table or database that is accessible by the system controller 140 for the target type of process to be run.

Once the duty cycle setting 422 is made, the equivalent pulsing power setting 426 can be calculated and determined. By way of example, if the duty cycle setting is 90%, the input pulsing power level to be supplied by the RF generator 130 to the bevel plasma chamber 103 can be calculated. The calculation can be based on empirical testing that identifies the amount of input power required to produce an effective power delivery to the bevel plasma chamber.

If the duty cycle is closer to 99%, then the increased power may be lower than if the duty cycle is closer to 10%. Accordingly, since the lower duty cycle setting 422 provides less effective power than a higher duty cycle setting 422, the adjusting calculation may be performed based on a formula, or may be based on empirical wafer test runs, or based on machine learning. In some embodiments, the adjusting calculation may be based on pre-calculated values obtained from a table or database.

Figure 5A:
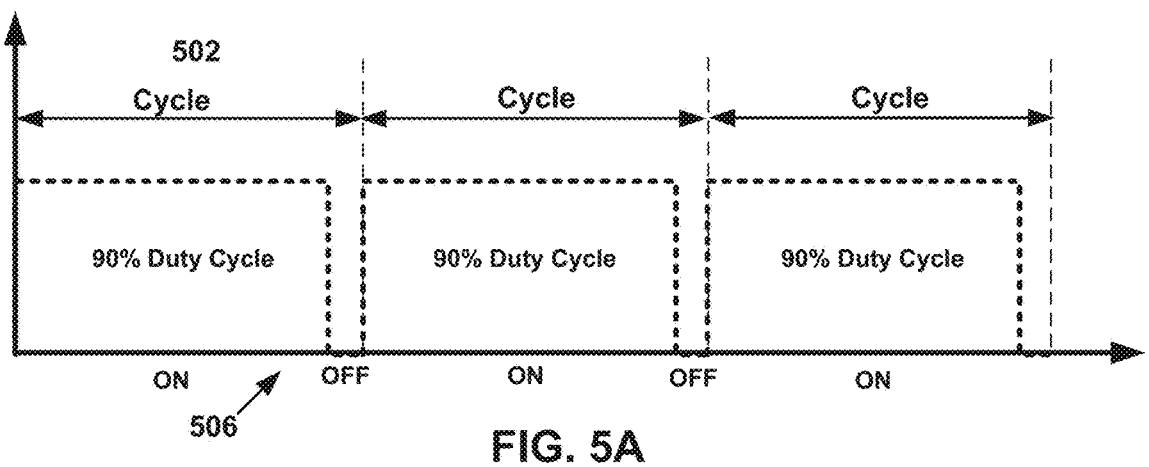
FIGS. 5A and 5B illustrate an example of the charge change at wafer edge for a few duty cycles operating during a process, in accordance with one embodiment of the present invention.
Figure 5B:
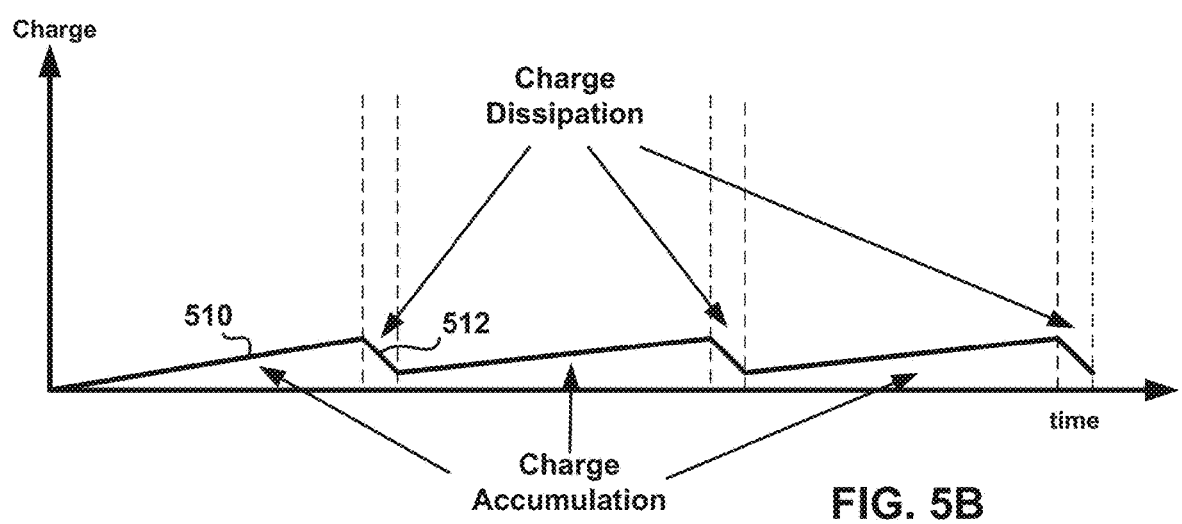

FIGS. 5A and 5B illustrate an example of a 90% duty cycle 506 operating during each cycle 502. In this example, in a pulsing mode, the ON time represents the percentage duty cycle. That is, a 90% duty cycle means that the RF power is delivered 90% of the time, while 10% of the time the generator does not deliver power. As mentioned above, the duty cycle settings can range between 10% and 99%. One example range that has shown even better results is between about 85% and about 95%. Generally speaking, if the duty cycle is high, less time will be provided for charge dissipation 512. At the same time, a lower duty cycle will have less charge accumulation 510 that can cause arcing damage.

However, having a higher duty cycle assists in increasing throughput, since more active etching or deposition is occurring when the RF power is delivered to the plasma in the bevel edge region 150. Given these trade-offs, it has been observed that having a higher duty cycle still provides significant reductions in charge build-up due to charge dissipation 512 occurring during the off times. Further, having a higher duty cycle will also assist in reducing the amount of increased power settings delivered by the system controller 142, to compensate for the loss of power delivered during the off time of a duty cycle. If further reductions in charge build-up are necessary, the system controller 140 can adjust the pulsing mode 136 to reduce the duty cycle. When the duty cycle is adjusted, a corresponding adjustment by the system controller 140, of the power settings 134, is made, to increase the power delivered by the RF generator 130.

Figure 6:
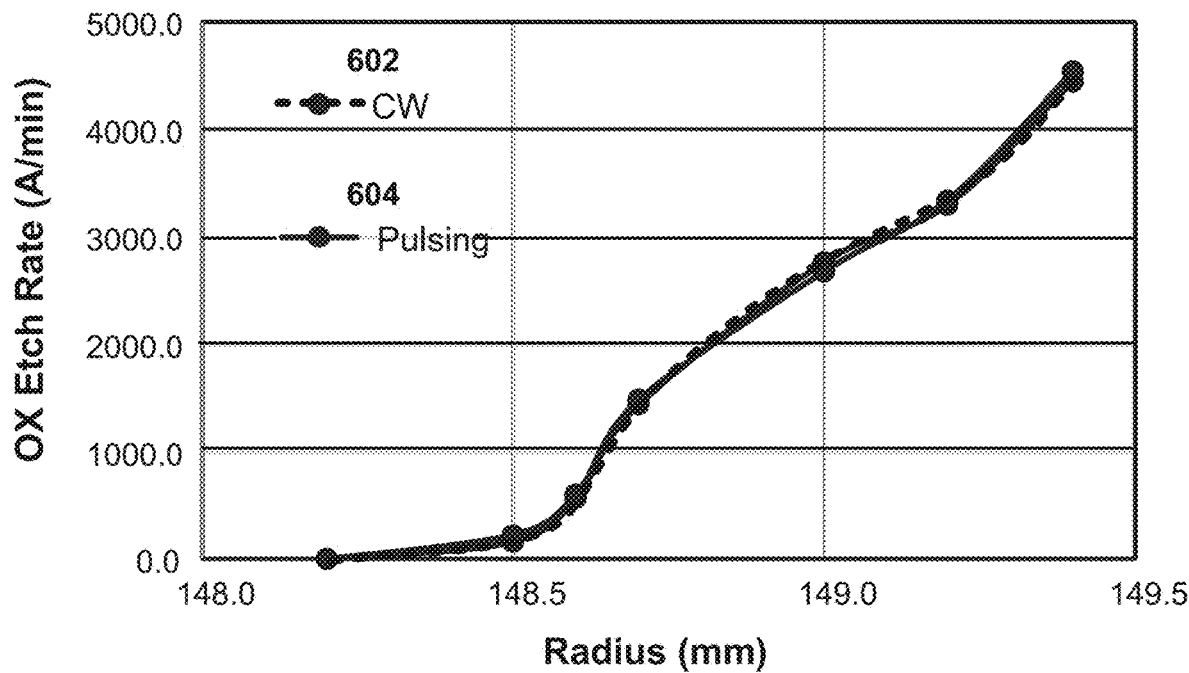
FIG. 6 illustrates an example of an oxide etch rate at the edge of the wafer, during CW and pulsing modes operating bevel processing chamber, in accordance with one embodiment of the present invention.

FIG. 6 illustrates an example of an oxide etch rate at the edge of the wafer, during a pulsing mode operating bevel processing chamber 103. As shown, the oxide etch rate, measured in Angstroms divided by minutes (A/min), is the material being removed from the edge of the wafer 101. In this example, the wafer is a 300 mm wafer, and measured from the center of the wafer out, the dimensions extend from 0 to 150 mm. The graph of FIG. 6 shows a radial region extending from 148 mm to 149.5 mm. Because the wafer 101 is disposed in a bevel processing chamber 103, the bevel edge region 150 is exposed to the etching plasma 220 as shown in FIG. 2B. This will cause a corresponding etch operation over the bevel edge of the wafer 101 for the portions of the wafer 101 that are exposed to plasma 220 (as shown in FIG. 2B).

The illustration provides test results that compare bevel edge etching utilizing a continuous wave (CW) 602 setting versus a pulsing mode 604 setting. As mentioned above, the pulsing mode 604 will have a corresponding adjustment to its power settings 134 in order to provide an equivalent effective power delivered to the bevel processing chamber 103. Once the increase in power has been made to the chamber when the pulsing mode 604 is in operation, it was shown that the etch rate performance of the pulsing mode 604 was substantially equivalent to the CW mode 602. In this example experiment, the system running the pulsing mode 604 is operating at a duty cycle of 90%. The increase in the power level over that used in the CW mode 602 was approximately 10%. Therefore, the bevel edge process under a pulsing mode 604 is able to operate with the same level of etch efficiency as a CW mode 602, but with the added benefit of reduced charge build-up and reduction in arcing damage 250. In one embodiment, the effective power is selected to achieve a target bevel processing throughput. If the process is a bevel edge etch process, the throughput is correlated to the etch rate. That is, by adjusting the input power slightly upward to compensate for the selected duty cycle, it is still possible to deliver the effective level of etching that ensures processing reaches a target bevel processing throughput.

Figure 7:
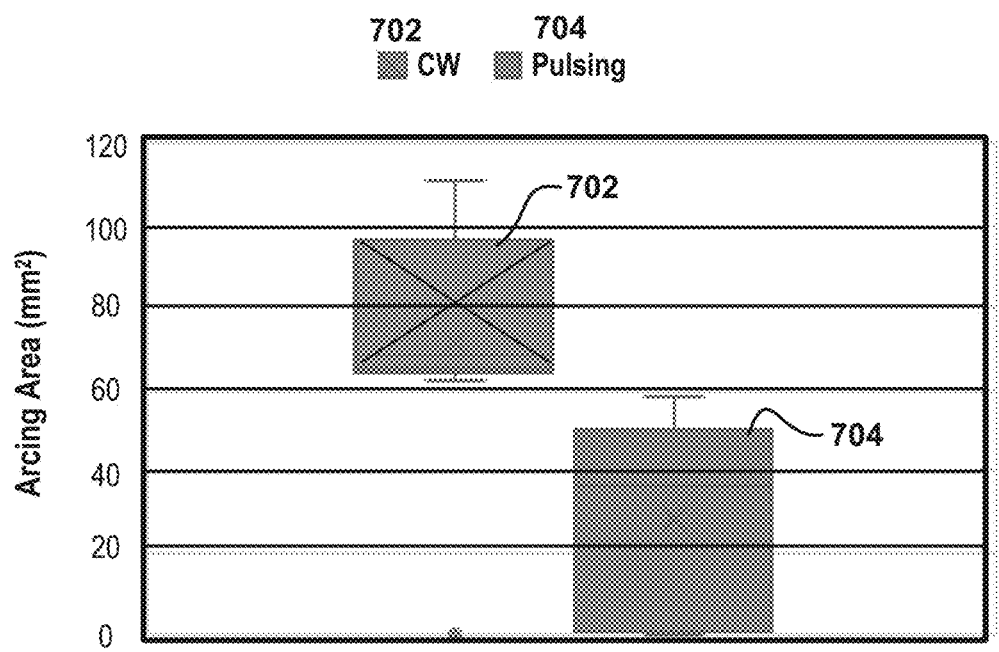
FIG. 7 illustrates results of arcing area at the edge of the wafer, for experiments run in CW mode and pulsing mode, in accordance with one embodiment of the present invention.

FIG. 7 illustrates results of arcing area, in mm$^2$, at the edge of the wafer 101, for experiments run in CW mode 702 and pulsing mode 704. The arcing area, as defined herein refers to the area around the circumference 207 of the wafer as shown in FIG. 3. For example, the arcing area refers to the amount of area that exhibits arcing when measured in the edge of the wafer 101a. Specifically, the arcing area is the amount of arcing regions around the circumference 207 near the edge of the wafer 101a, on the top surface of films disposed on the wafer 101. In one embodiment, it has been determined that increasing the pulsing frequency of the pulsing mode 704 has a corresponding effect to reduce the amount of arcing area.

Figure 8:
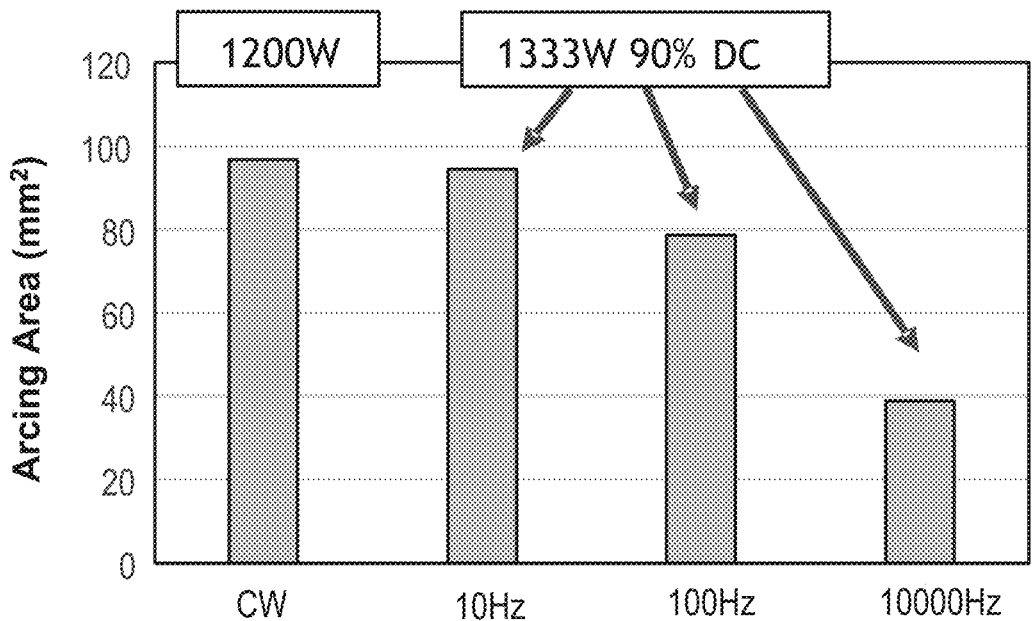
FIG. 8 illustrates increases in pulsing frequency to reduce area damage in a circumference of a wafer, in accordance with one embodiment of the present invention.

With reference to FIG. 8, it is shown that the arcing area, in mm$^2$, reduces significantly as the pulsing frequency is increased. An example is shown where 10 Hz provides for an arcing area similar to a continuous wave mode of operation. In order to significantly reduce the arcing area, as shown in FIG. 7, the pulsing frequency is increased by the system controller 140 utilizing frequency settings 138. The illustration in FIG. 7 shows an approximate range of arcing area resulting from higher pulsing frequency operation. That is, for a continuous wave mode 702, more arcing area is consumed with arcing damage as shown in FIG. 3, whereas in pulsing mode 704 less arcing area is exhibited because the pulsing frequency is increased as shown in FIG. 8. In one experiment, using the FIG. 8 example, when the pulsing frequency was adjusted to 10000 Hz, it was observed that over a 60% reduction in arcing area was achieved. This experiment shows that pulsing frequency adjustments are usable as a tuning knob to control the area in which arcing damage would occur if charge build-up occurred.

It should be understood that increasing the pulsing frequency of the pulsing mode 704 is an optional feature, if the arcing area in a process needs additional reduction in arcing area. It should be understood however, that if the charge dissipates sufficiently due to the pulsing mode operation, the increase in pulsing frequency may not be needed. Adjusting the pulsing frequency upwards provides an additional tuning knob, depending on the process.

Figure 9:
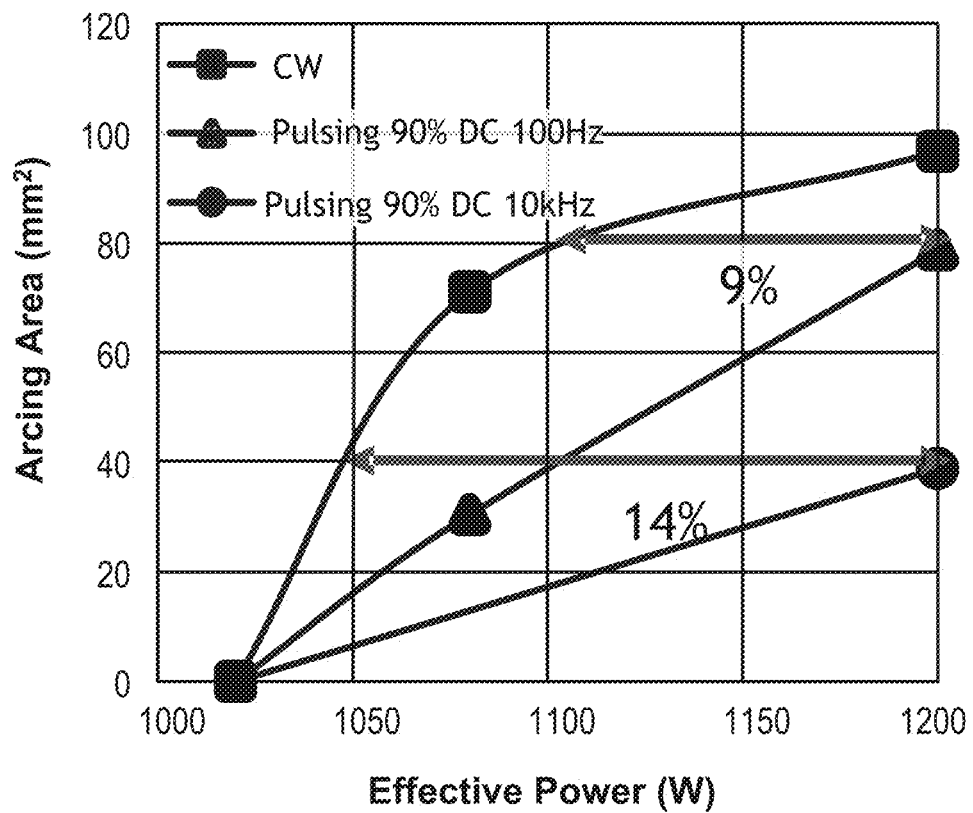
FIG. 9 graphically illustrates the advantage of operating a pulsing mode and also increasing the pulsing frequency, as compared to a continuous wave mode of operation, in accordance with one embodiment of the present invention.

FIG. 9 graphically illustrates the advantage of operating a pulsing mode and also increasing the pulsing frequency, as compared to a continuous wave mode of operation. As shown, the effective power delivered to the bevel processing chamber 103 is programmed to be about 1200 Watts. In the continuous wave (CW) mode of operation, the system will reach 1200 Watts, but the arcing area will be substantially higher. By increasing the pulsing power of the pulsing mode to 1333 W at 90% duty cycle, it achieves the same effective power of 1200 Watts, but by increasing the pulsing frequency, it substantially reduces the arcing area that could be susceptible to arcing. In one example, the 9% and the 14% represent the gain achieved in effective power when using the pulsing mode, while having the same arcing area as CW. For instance, with 1050 W CW, the arcing area is 40 mm$^2$, and by pulsing at 10 KHz, the power is increased to 1200 W.

This illustration references a 90% duty cycle, but as mentioned above, the duty cycle may be programmatically set by the controller 140 depending on the process operation utilized or targeted. Additionally, the effective power of 1200 Watts is only by way of example, and is only shown for the experimental testing performed to show that a pulse mode with a higher pulsing frequency of operation can achieve lower arcing areas around the top surface of the wafer in the circumference than utilizing a continuous wave mode of operation.

Figure 10A:
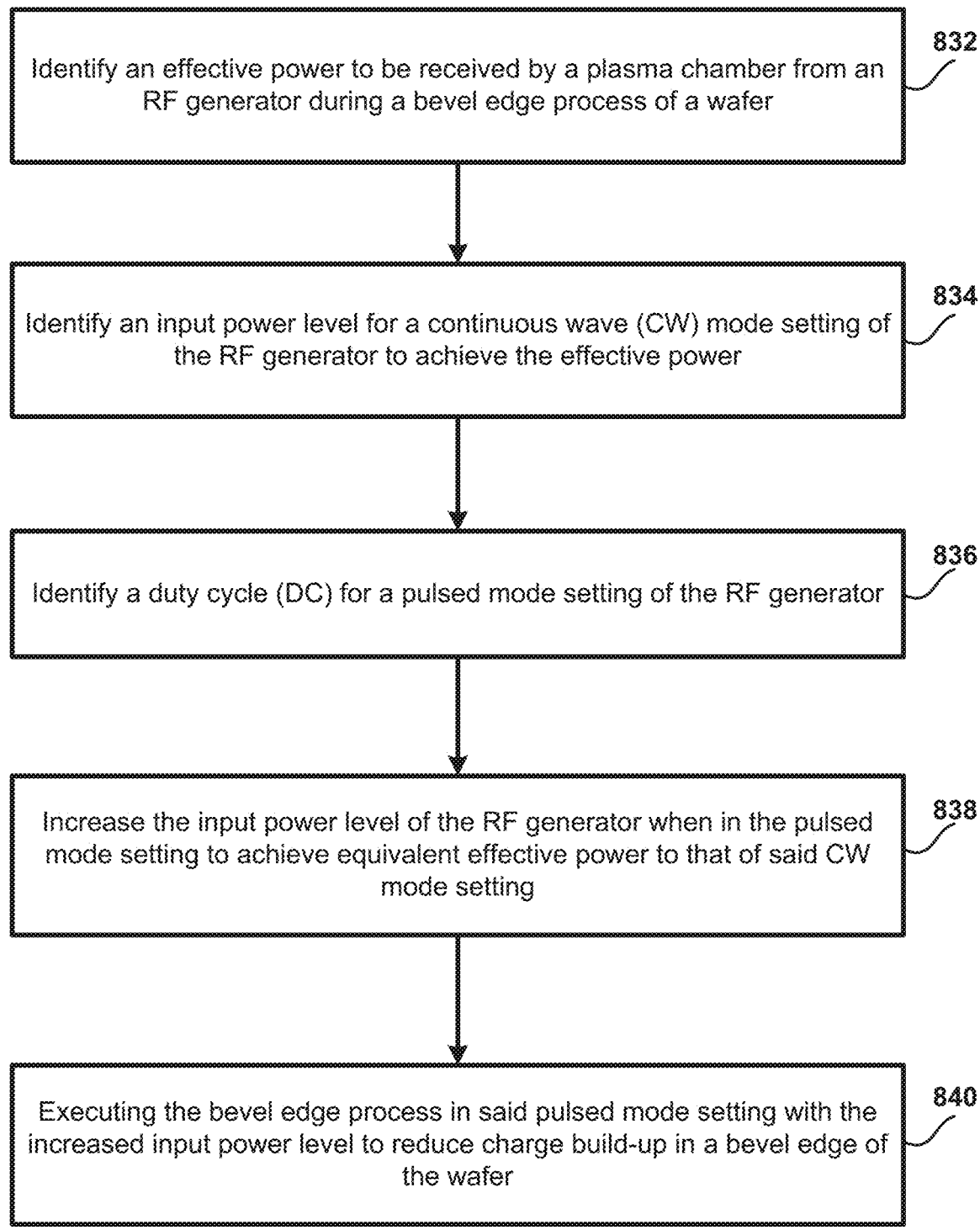
FIGS. 10A and 10B illustrates example process operations for running a pulsed mode operation in a bevel processing chamber, in accordance with one embodiment.

FIG. 10A illustrates an example of a process for operating a bevel processing chamber, in accordance with one embodiment. In operation 832, an effective power to be received by the plasma chamber is identified. The effective power is one that is selected to process a bevel edge process on the wafer. As mentioned above, the bevel edge process can be a deposition process or an etch process. The controller 140 is configured to identify the input power level for a continuous wave mode setting of the RF generator to achieve the effective power in operation 834. Once the input power is identified, a duty cycle for a pulse mode setting of the RF generator is identified by the system controller 140 in operation 836. Based on the duty cycle setting of the pulse mode, the system controller will increase, in operation 838, the input power level of the RF generator to achieve an equivalent effective power that would have been received by a CW mode setting. The system controller may increase the input power of the RF generator 130 by identifying a compensation factor in a manner consistent with the various embodiments described herein. Additionally, the system controller 140 may apply the identified compensation factor to control the increase of input power provided by the RF generator 130.

By way of example, FIG. 4A illustrates that an additional amount of power is required based on the chosen duty cycle to achieve a substantially equivalent residual charge voltage and resulting input power of the RF generator 130. In operation 840, the bevel edge process is executed in said pulse mode setting with the increased input power level to reduce charge build-up in a bevel edge of the wafer.

Figure 10B:
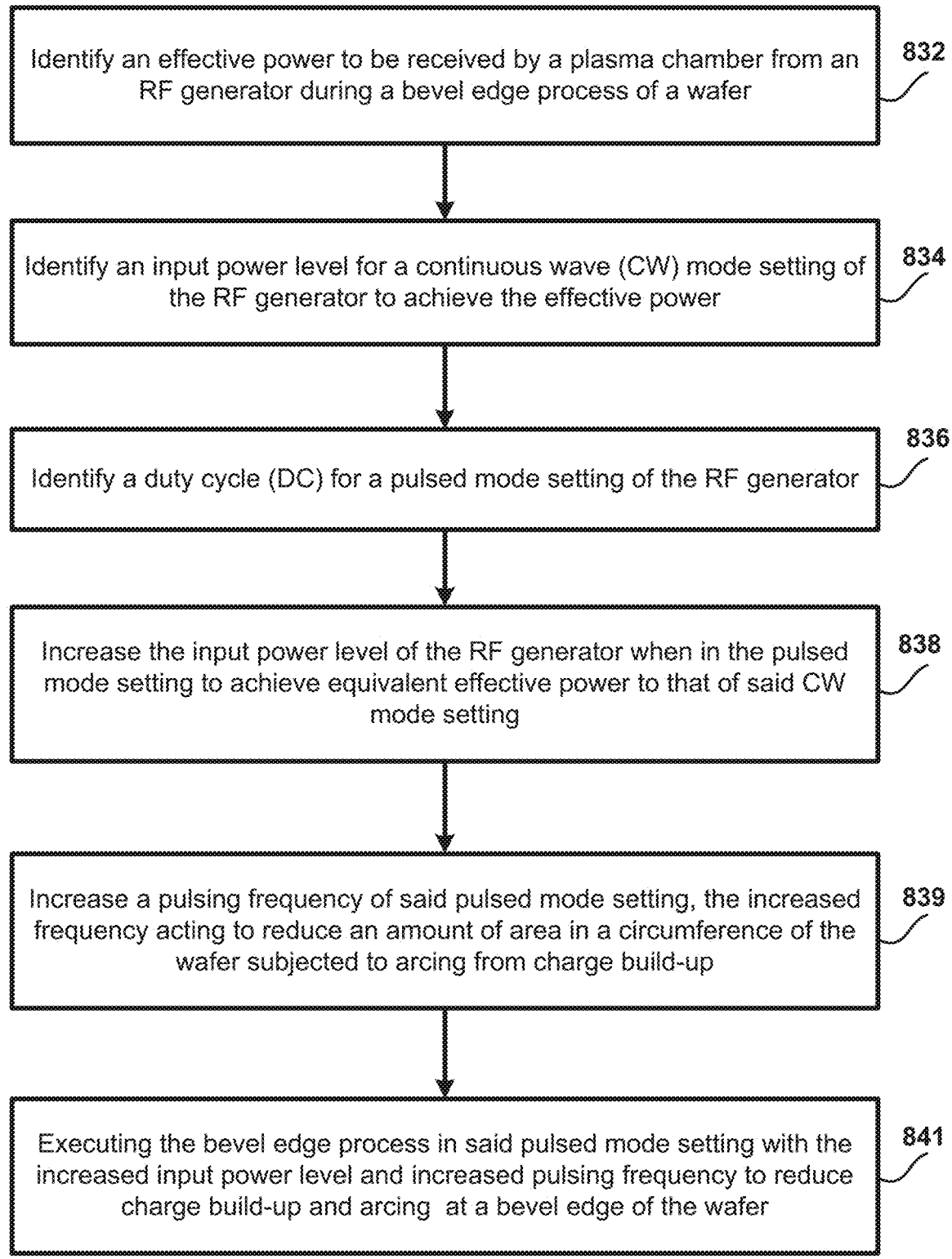

FIG. 10B illustrates an embodiment where operations 832 through 838 are process similar to FIG. 10A. In operation 839, a pulsing frequency of the RF generator is increased in the pulse mode setting. The increased pulsing frequency will act to reduce an amount of area in the circumference of the wafer that would be subjected to arcing from charge build-up. As mentioned above, increasing the pulsing frequency is an optional operation if charge build-up is still occurring after the duty cycle has been selected for the pulse mode setting. In operation 841, the bevel edge process is executed in the pulse mode setting with the increased power level and the increased pulsing frequency to reduce the charge build-up and arcing at the bevel edge of the wafer.

In still another embodiment, a table including settings for an input power level can be predefined based on empirical testing. These input power levels can be designed to achieve the effective power that is similar to a continuous wave mode. Therefore, instead of having to identify the input power level of the CW mode setting, the controller simply applies an input power level that is higher to compensate for the selected duty cycle percentage. As mentioned above, the selected duty cycle will identify the amount of time that the RF generator is on, and if the generator is on close to 99% of the time, then the power increase for the input power would be minimal. In the case of a 90% duty cycle, the increased input power could be approximately 5% to 20% more than would be needed if the RF generator would be operating in a continuous mode. Generally speaking, by operating in the pulse mode and setting a desired duty cycle, it is possible to reduce the amount of charge build-up in the bevel edge region 150, which correspondingly reduces arcing damage 250.

Figure 11:
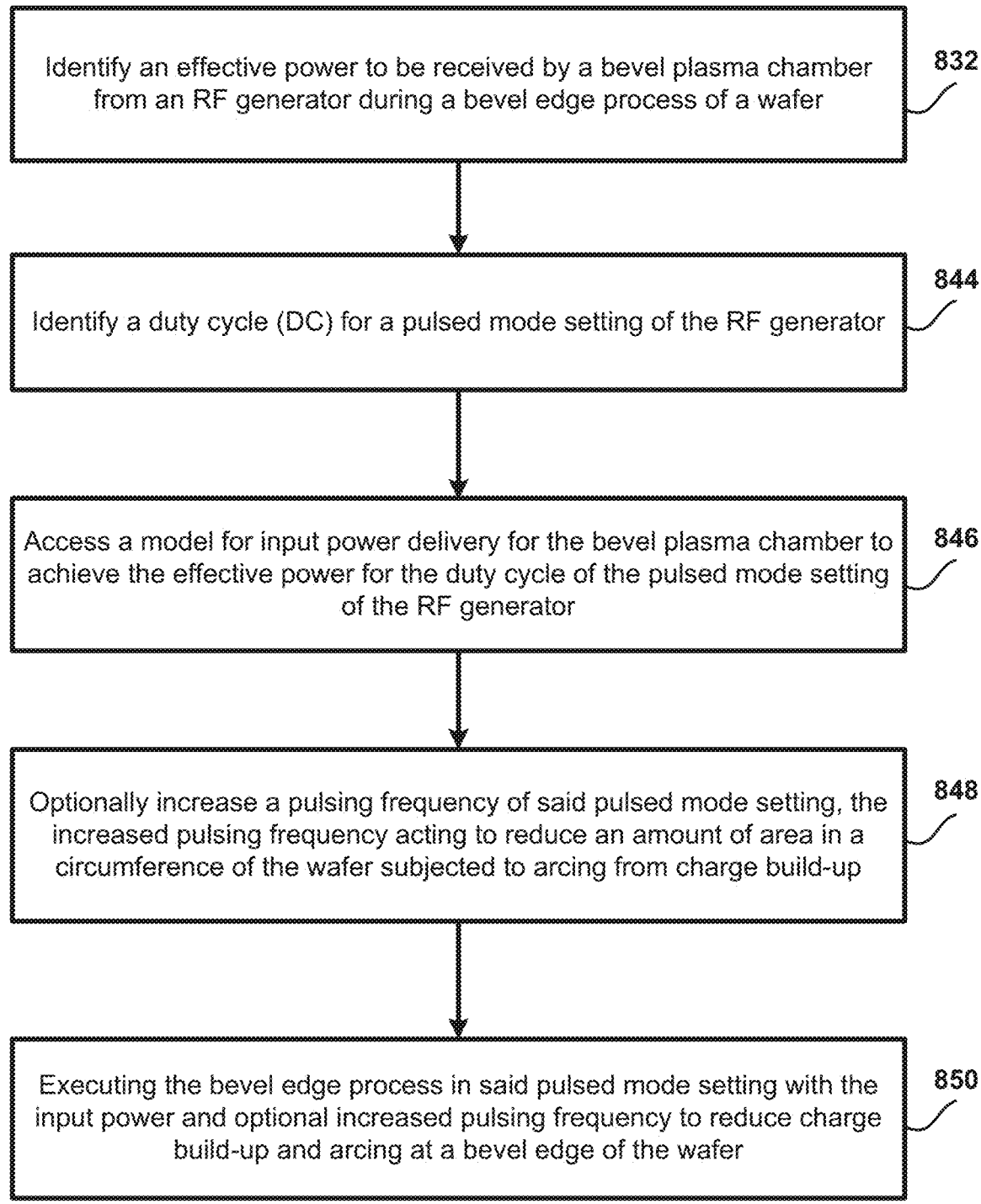
FIG. 11 illustrates an embodiment where an effective power is supplied to a bevel plasma chamber from an RF generator, compensating for loss of power due to duty cycle setting, in accordance with one embodiment.

FIG. 11 illustrates an embodiment where an effective power that is to be supplied to a bevel plasma chamber from an RF generator is identified in operation 832. In operation 844, a duty cycle is identified for a pulsed mode setting to be supplied to the RF generator. As mentioned above, the duty cycle can be selected and optimized for a specific bevel edge process. In some cases, charge build-up is more of an issue, so the duty cycle is adjusted downward. In other cases, charge build-up is minimal, so the duty cycle can be closer to 99%, in the pulse mode. In operation 846, a model for input power is accessed. The model may be a program that correlates an amount of increased power needed to compensate for the selected duty cycle. In some embodiments, the model may be modeling data that was built from empirical testing. In still other embodiments, the modeling data may be constructed from machine learning, so that the optimum input power is set for the RF generator based on the selected process and the selected duty cycle.

In operation 848, an optional step of adjusting the pulsing frequency upward by an amount is processed. The amount of pulsing frequency adjustment is configured to assist in reducing an amount of area in which charge build-up may occur in the perimeter of the wafer edge. The amount by which the pulsing frequency is adjusted can be set based on modeling data as well. The model can be built based on empirical testing, based on dynamic real-time feedback, or based on predefined settings. Once the pulsing frequency of the RF generator is adjusted, if needed, operation 850 is executed, wherein the bevel edge process is run using a pulse mode with a set duty cycle, so as to reduce charge build-up and associated arcing damage.

Figure 12:
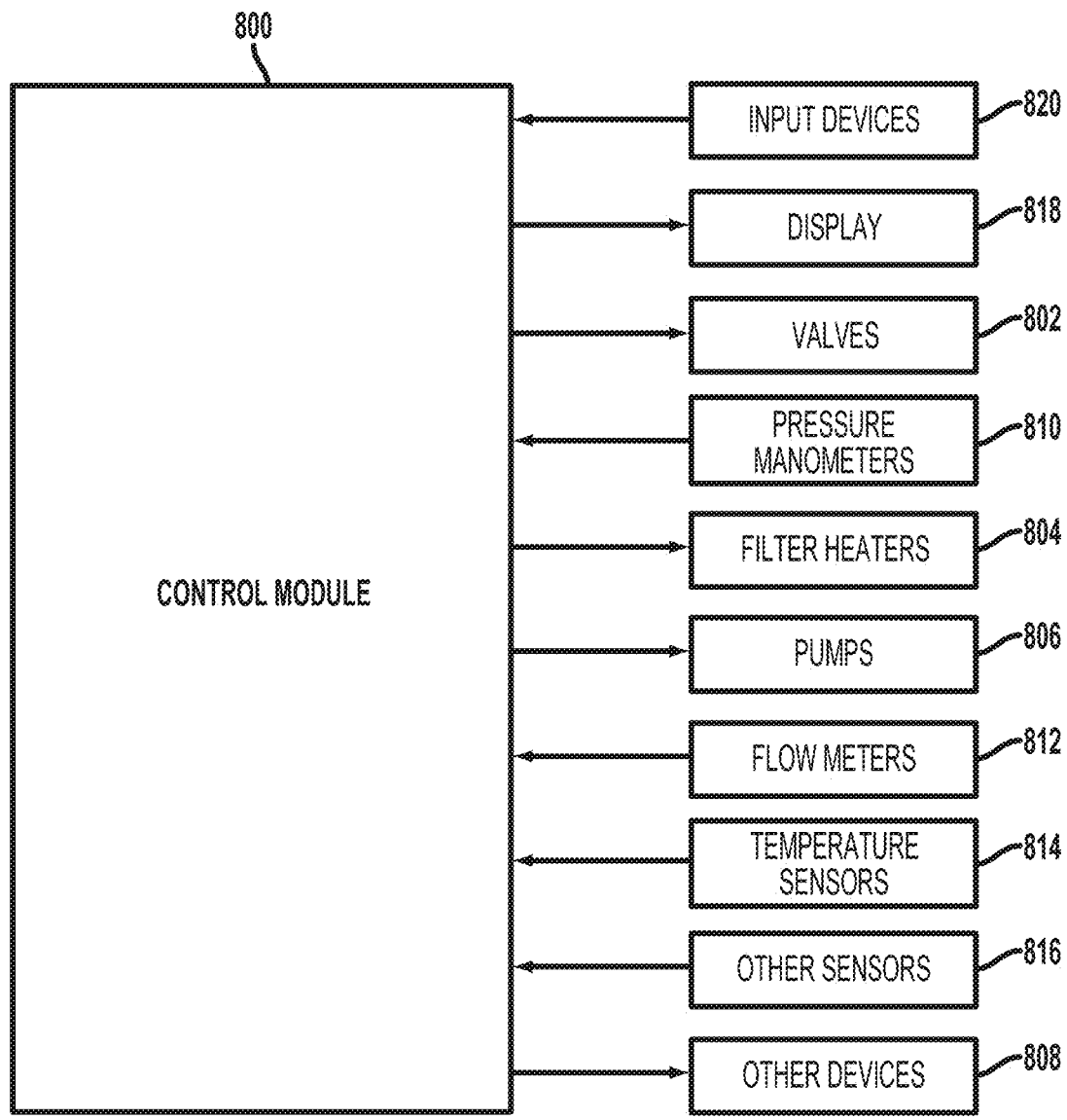
FIG. 12 shows a control module for controlling the systems, in accordance with one embodiment.

FIG. 12 shows a control module 800 for controlling the systems described above, including the gap control 108. In one embodiment, the control module 800 of FIG. 12 may include some of the example components. For instance, the control module 800 may include a processor, memory and one or more interfaces. The control module 800 may be employed to control devices in the system based in part on sensed values. For example only, the control module 800 may control one or more of valves 802, filter heaters 804, pumps 806, and other devices 808 based on the sensed values and other control parameters. The control module 800 receives the sensed values from, for example only, pressure manometers 810, flow meters 812, temperature sensors 814, and/or other sensors 816. The control module 800 may also be employed to control process conditions during precursor delivery and deposition of the film. The control module 800 will typically include one or more memory devices and one or more processors.

The control module 800 may control activities of the precursor delivery system and deposition apparatus. The control module 800 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 800 may also monitor the pressure differential and automatically switch vapor precursor delivery from one or more paths to one or more other paths. Other computer programs stored on memory devices associated with the control module 800 may be employed in some embodiments.

Typically there will be a user interface associated with the control module 800. The user interface may include a display 818 (e.g. a display screen and/or graphical software displays of the apparatus and/or process conditions), and user input devices 820 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 810, and thermocouples located in delivery system, the pedestal or chuck (e.g. the temperature sensors 814). Appropriately programmed feedback and control algorithms may be used with data from these sensors to maintain desired process conditions. The foregoing describes implementation of embodiments of the invention in a single or multi-chamber semiconductor processing tool.

In some implementations, a controller 140 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A method for operating a bevel edge process in a plasma chamber, comprising:
    providing a wafer over a lower electrode of the plasma chamber, the plasma chamber having an insulator plate disposed over the lower electrode, the insulator plate is set at a distance that is a separation from a top surface of the wafer so as to prevent plasma formation over the top surface of the wafer, the plasma chamber including an outer lower electrode surrounding the lower electrode and an outer upper electrode surrounding the insulator plate, wherein an edge of the wafer is disposed between the outer upper electrode and the outer lower electrode;
    setting a radio frequency (RF) power generator to operate in a pulsing mode, the pulsing mode is configured to deliver a duty cycle that is greater than about a 10% setting and less than about a 99% setting, the RF power generator connected to the lower electrode while the outer upper electrode and the outer lower electrode are connected to a ground potential; and
    setting a power level of the RF power generator, based on a setting of the duty cycle, to increase by a smaller increment as the setting of the duty cycle is reduced from said 99% setting.

2. The method of claim 1, wherein for the 10% setting, the RF power generator is in an ON state 10% of a cycle and in an OFF state during 90% of the cycle.

3. The method of claim 1, wherein capacitive coupling between the outer upper electrode and the outer lower electrode forms an edge plasma used for a deposition process or an etch process at the edge of the wafer.

4. The method of claim 3, wherein for the etch process, the increased power level is configured to offset a reduction in etch rate when in the pulsing mode as compared to a continuous wave (CW) mode of power delivery by a CW RF power generator.

5. The method of claim 3, wherein setting the power level of the RF power generator to increase by the smaller increment as the duty cycle is reduced from the 99% setting enables dissipation of charge in an area around the wafer edge, the dissipation of charge causes reduction in charge build-up that causes arcing with metallic materials in the area around the wafer edge.

6. The method of claim 1, wherein the duty cycle during said pulsing mode is a percentage setting between said about 10% setting and said about 99% setting, and said percentage setting of the duty cycle is correlated to a predefined increased power level relative to a power level during a continuous wave (CW) mode of power delivery by a CW RF power generator.

7. The method of claim 6, wherein the percentage setting of the duty cycle enables dissipation of charge in an area around the wafer edge for reducing charge build-up that causes arcing in the area around the wafer edge.

8. The method of claim 1, wherein during said pulsing mode, further comprising,
    increasing a pulsing frequency setting of the RF power generator, such that the increased power level of the RF power generator functions to deliver an effective power for said bevel edge process that approximates power delivered for a continuous wave (CW) mode of power delivery by a CW RF power generator.

9. The method of claim 1, further comprising,
    setting the RF power generator to operate at a stepped up pulsing frequency during said pulsing mode relative to a continuous wave (CW) mode.

10. The method of claim 9, wherein the stepped up pulsing frequency functions to reduce an arcing area around a circumference of the wafer during said bevel edge process.

11. The method of claim 10, wherein the duty cycle setting together with the increased power level during said pulsing mode acts to deliver an effective power to the bevel edge process as delivery of power using the CW mode.

12. The method of claim 11, wherein the delivery of power using the CW mode is lower than in the pulsing mode.

13. The method of claim 1, wherein the duty cycle is at a 90% setting, such that the RF power generator is in an ON state 90% of a cycle and in an OFF state during 10% of the cycle.

14. A method for processing a bevel edge of a wafer in a bevel plasma chamber, further comprising,
    receiving a pulsed mode setting for a generator of the bevel plasma chamber;
    identifying a duty cycle for the pulsed mode, the duty cycle defining an ON time and an OFF time during each cycle of power delivered by the generator;
    identifying a compensation factor to an input power setting of the generator, the compensation factor is configured to add an incremental amount of power to the input power setting to account for a loss in power attributed to the duty cycle being run in the pulsed mode instead of a continuous wave mode, the incremental amount defined, based on a setting of the duty cycle, is set to increase as the duty cycle is reduced from a high setting to a low setting; and
    running the generator in the pulsed mode with the duty cycle, the generator is configured to generate the input power that includes incremental amount of power based upon the compensation factor to achieve an effective power in the bevel plasma chamber, the effective power is selected to achieve a target bevel processing throughput.

15. The method of claim 14, wherein the duty cycle is greater than about a 10% setting and less than about a 99% setting, and wherein the low setting is defined to be closer to the 10% setting and the high setting is defined to be closer to the 99% setting.

16. The method of claim 14, wherein the pulsed mode enables dissipation of charge in an area proximate to the bevel edge of the wafer for reducing charge build-up that causes arcing with metallic materials over a surface of the wafer in the area proximate to the bevel edge.

17. The method of claim 14, wherein the incremental amount of power is correlated to an incremental loss in effective power attributed to the duty cycle to be run in the pulsed mode.

18. The method of claim 17, wherein a sensor is coupled to the bevel plasma chamber to determine the incremental loss in effective power and feed back the compensation factor selected for processing the bevel edge with said pulsed mode.

19. A system for processing a bevel edge of a wafer in a bevel plasma chamber, comprising, the bevel plasma chamber having a lower electrode and an insulator plate disposed over the lower electrode, the insulator plate is set at a distance that is a separation from a top surface of the wafer so as to reduce plasma formation over the top surface of the wafer, the plasma chamber including an outer lower electrode surrounding the lower electrode and an outer upper electrode surrounding the insulator plate, wherein an edge of the wafer is disposed between the outer upper electrode and the outer lower electrode;

a controller configured to receive a pulsed mode setting for a generator of the bevel plasma chamber;

the controller configured to identify a duty cycle for the pulsed mode, the duty cycle defining an ON time and an OFF time during each cycle of power delivered by the generator;

the controller configured to apply a compensation factor to an input power setting of the generator, the compensation factor is configured to add an incremental amount of power to the input power setting to account for a loss in power attributed to the duty cycle to be run in the pulsed mode instead of a continuous wave mode, wherein the incremental amount of power is defined based on a setting of the duty cycle in the pulsed mode and is set to increase as the duty cycle is reduced from a high setting to a low setting; and the controller configured to operate the generator in the pulsed mode with the duty cycle, the generator is configured to generate the input power that includes the incremental amount of power to achieve an effective power in the bevel plasma chamber, the effective power is selected to achieve a target bevel processing throughput.

20. The system of claim 19, wherein the pulsed mode enables dissipation of charge in an area proximate to the bevel edge of the wafer for reducing charge build-up that causes arcing with metallic materials over a surface of the wafer in the area proximate to the bevel edge.

* * * * *